(12) United States Patent
Shi

(10) Patent No.: US 7,391,119 B2
(45) Date of Patent: Jun. 24, 2008

(54) TEMPERATURE SUSTAINING FLIP CHIP ASSEMBLY PROCESS

(75) Inventor: Song-Hua Shi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 352 days.

(21) Appl. No.: 11/040,345

(22) Filed: Jan. 20, 2005

(65) Prior Publication Data

US 2005/0121762 A1  Jun. 9, 2005

Related U.S. Application Data

(62) Division of application No. 10/403,755, filed on Mar. 31, 2003, now Pat. No. 6,902,954.

(51) Int. Cl.
*H01L 21/66* (2006.01)
*H01L 21/00* (2006.01)
*H01L 29/40* (2006.01)

(52) U.S. Cl. .......................... 257/778; 257/787; 438/15; 438/25; 438/26; 438/51; 438/106; 438/108; 438/112; 438/124; 438/126; 438/127

(58) Field of Classification Search ....................... None
See application file for complete search history.

(56) References Cited

U.S. PATENT DOCUMENTS

| | | | |
|---|---|---|---|
| 5,128,746 A | 7/1992 | Pennisi et al. | |
| 5,975,408 A | 11/1999 | Gossen | |
| 6,132,646 A | 10/2000 | Zhou et al. | |
| 6,180,696 B1 | 1/2001 | Wong et al. | |
| 6,229,220 B1 | 5/2001 | Saitoh et al. | |
| 6,348,738 B1* | 2/2002 | Dery et al. ................... | 257/778 |
| 6,373,142 B1 | 4/2002 | Hoang | |
| 6,397,932 B1* | 6/2002 | Calaman et al. ............ | 165/80.4 |
| 6,488,806 B2 | 12/2002 | Carden et al. ............... | 156/311 |
| 6,489,180 B1 | 12/2002 | Tsai et al. | |
| 6,495,917 B1* | 12/2002 | Ellis-Monaghan et al. .. | 257/758 |
| 6,564,988 B1 | 5/2003 | Shiraishi et al. | |
| 6,773,958 B1* | 8/2004 | Wang ........................... | 438/108 |
| 6,909,176 B1 | 6/2005 | Wang et al. .................. | 257/706 |
| 6,919,420 B2* | 7/2005 | Buchwalter et al. ......... | 528/230 |
| 6,992,391 B2* | 1/2006 | Ott et al. ...................... | 257/758 |
| 7,190,082 B2 | 3/2007 | Nagarajan et al. ........... | 257/795 |
| 2001/0003058 A1 | 6/2001 | Gilleo et al. | |
| 2001/0053448 A1 | 12/2001 | Satsu | |
| 2002/0032280 A1 | 3/2002 | Charles et al. | |
| 2002/0106515 A1 | 8/2002 | Carpenter et al. | |
| 2002/0110956 A1 | 8/2002 | Kumamoto et al. | |
| 2002/0128354 A1 | 9/2002 | Garrett | |

(Continued)

FOREIGN PATENT DOCUMENTS

EP  0878839  11/1998

(Continued)

*Primary Examiner*—Carl Whitehead
*Assistant Examiner*—James M Mitchell
(74) *Attorney, Agent, or Firm*—Blakely, Sokoloff, Taylor & Zafman LLP

(57) ABSTRACT

A temperature sustaining flip chip process in which ILD cracking and delamination are lessened. A sequence of substrate prebake, underfill dispense, chip placement, solder reflow and underfill cure operative stages introduces lower thermal-mechanical stress during flip chip packaging.

18 Claims, 4 Drawing Sheets

U.S. PATENT DOCUMENTS

2003/0096453 A1 5/2003 Wang et al.
2003/0222314 A1 12/2003 Nair .......................... 257/368
2004/0118586 A1* 6/2004 Hua .......................... 174/52.2
2005/0242444 A1* 11/2005 Huang et al. ................ 257/778

FOREIGN PATENT DOCUMENTS

JP  RD 291011  7/1988

* cited by examiner

TEMPERATURE SUSTAINING FLIP CHIP ASSEMBLY PROCESS

This is a Divisional Application of Ser. No.: 10/403,755 filed Mar. 31, 2003 now U.S. Pat. No. 6,902,954, which is presently pending.

FIELD OF THE INVENTION

The embodiments of the present invention relate to a method to assemble or package an integrated circuit chip and a microelectronic die (chip) assembly manufacture utilizing the process.

BACKGROUND OF THE INVENTION

A variety of techniques are available to assemble microelectronic die, such as an integrated circuit device (commonly referred to as an IC chip), into a component or a package. One type of packaging employs a flip chip package, such as a C4 flip chip package, to mount the die onto a package substrate. In one such flip chip packaging technique, a dielectric material, such as a low-dielectric constant (low-k) material layer, is used in-between the metal layers on the active die side for higher electrical performance and contact pads or bumps reside along the surface to mate the conductive contacts (terminals) to electrically join the die to the package substrate. A joint forms at the mating of the electrical conductive paths. In order to assemble the die onto the package substrate, a common technique is to employ a sequence of operative stages that subject the two components to significant temperature variations.

For example, in one die to substrate assembly technique the sequence of stages practiced includes the following: 1) die placement 2) solder reflow 3) deflux 4) prebake 5) underfill dispense 6) underfill cure. In this example sequence, significant temperature differentials are experienced between some of the stages. In the example technique, die placement typically occurs at room temperature (25° C.) but the temperature of the joint rises to approximately 221° C. during the solder reflow stage. The solder reflow is used to electrically join the electrical contacts of the die and the package substrate. After the electrical bonding of the die to the substrate, the assembled unit is allowed to cool to room temperature prior to commencing the next stage, which is the deflux stage. The cooling usually is encountered, since the solder reflow operation occurs in one equipment while deflux is performed in another. Typically, the substrate with the die is transported from one equipment to the other, allowing ample time for the electrical contacts to cool from about 221° (temperature of solder reflow) to room temperature (approximately 25° C.). In some instances the lag period may not be avoided, since solder reflow operation is performed on single units, while the deflux operation is performed on multiple assembled units in a batch process. The assembled units cool from the higher temperatures encountered at the solder reflow while waiting to be stacked and transported to the equipment which performs the deflux operation. In a typical deflux operation, the temperature is again raised to approximately in the range of 80° C.

Once the deflux stage has been completed to remove unwanted flux residue, the assembled units are then transported to another equipment to perform the prebake operation. Again at this point the assembled units are lowered to the room temperature of 25° C. for transport before the prebake operation is performed. In one prebake operation, the packaged assemblies are raised to a temperature range of approximate 163° C. Subsequently, underfill dispense is performed to fill the void area between the die and the substrate with the underfill material. Then, the underfill is allowed to cure in the sixth stage. In one practice, the underfill dispense is performed at about 110° C. and subsequently the assembly is allowed to cool to room temperature, after which the underfill cure is performed at about 163° C.

In the above example, the die and substrate assembly undergo considerable temperature changes as it sequences through the six operative stages. One of the more significant temperature differential occurs when the solder reflow is performed on the assembly (at about 221° C.) and subsequently allowed to cool to room temperature. A temperature differential of approximately 195° C.-200° C. may be encountered when the assembly is allowed to cool after the reflow operation. As noted, the first five stages occur without the underfill protection residing between the die and substrate and only the last step (underfill cure) is performed with the underfill support between the die and the substrate. Also, during the first five operative stages, where no underfill protection is provided, the assembly undergoes various temperature changes including three occasions at which point the die and substrate assembly are allowed to cool to room temperature. Again the most likely point for the biggest temperature differential occurs after the solder reflow.

Because the cooling of the assembly to the ambient or room temperature may occur several times before the underfill material supports the die on the substrate, there is a tendency for the dielectric material of the die (as well as the substrate) to experience cracking or delamination. Such cracking or delamination may be enhanced if the dielectric material is a low k dielectric such as a low-k dielectric layer, typically used for inter-level dielectric (ILD). The temperature changes may cause considerable thermal stress, especially in the instance where the coefficient of thermal expansion (CTE) differs significantly for the materials present. In the particular case, CTE mismatch is between the silicon and the dielectric material.

DETAILED DESCRIPTION OF THE EMBODIMENTS OF THE INVENTION

Figure 1:
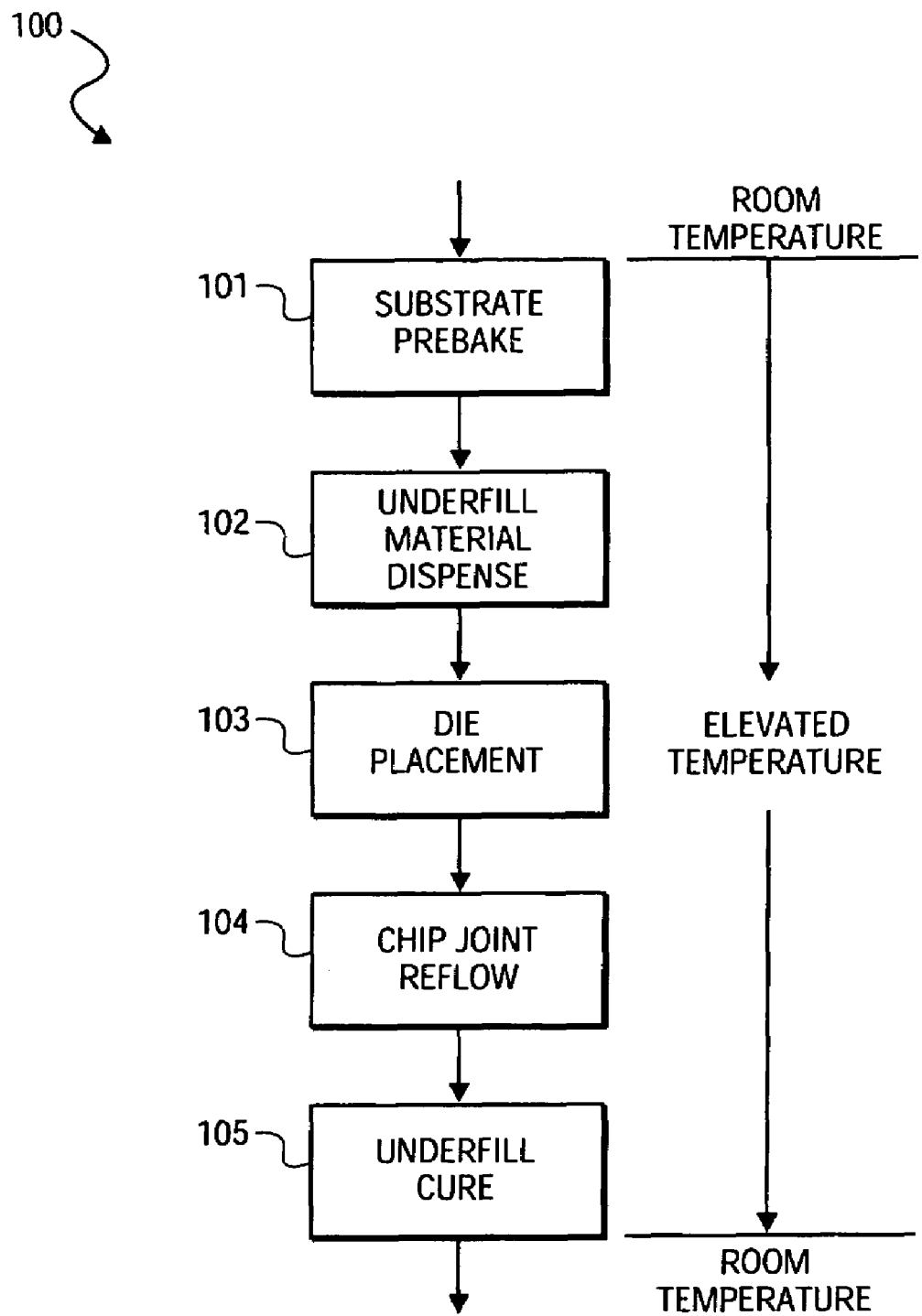
FIG. 1 shows a flow diagram a flip chip attachment process to practice one embodiment of the invention.
Figure 2:
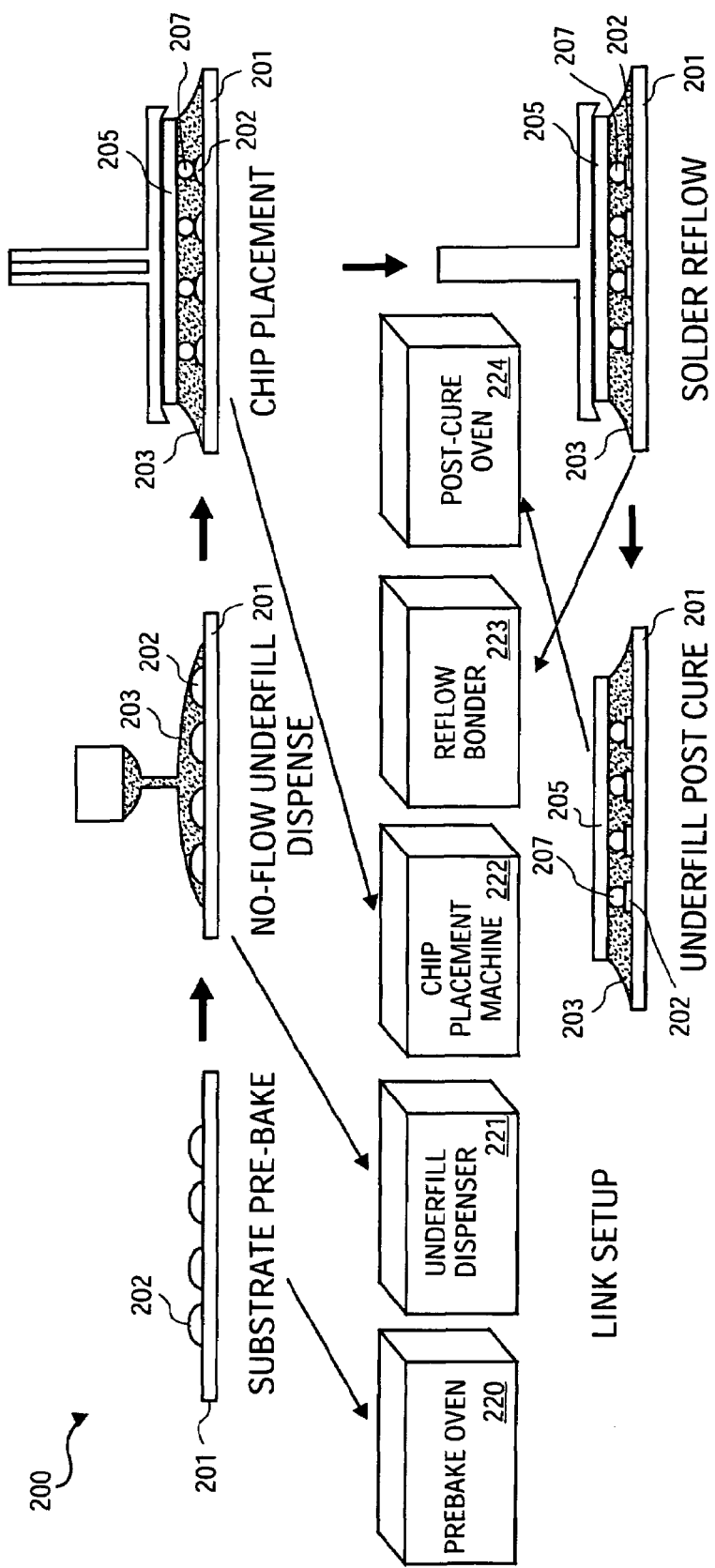
FIG. 2 shows an equipment and assembly flow diagram as an example of implementing the process shown in FIG. 1.

Referring to FIG. 1, a process flow diagram 100 exemplifying five stages for attaching (or bonding) a microelectronic die (such as an integrated circuit chip) onto to a package substrate is illustrated. Five operative stages (shown as blocks) 101-105 exemplify the five stages implemented to attach the die onto the substrate. A diagram illustrating an example set up of the equipment to perform the five stages 101-105 to attach the die is illustrated in FIG. 2. It is to be noted that a variety of integrated circuit (IC) devices, including semiconductor devices, may use the described process to attach a microelectronic die on to a package substrate to form an assembly. In one particular embodiment, the IC chip is manufactured from a silicon wafer in which multiple conductive layers (metals layers) reside on the chip. The metal layers are separated by dielectric materials (including organic or inorganic materials), such as low-k dielectrics or ultra low-k dielectrics. Similarly, the package substrate may include dielectric materials (including organic and inorganic materials), such as low-k dielectrics. Contacts, terminals, pads, bumps, etc. that are conductive are present on the surface of the dielectric of the package substrate to mate to conductive terminals present on the die. The package substrate and the chip are attached at the terminal joint during the attachment assembly process.

As noted, a variety of dielectric materials may be used for the dielectric layers. These dielectric layers on the die are generally referred to as inter-level dielectric (ILD) layers or simply, ILD. In one particular example, low dielectric constant (low-k, ultra low-k, etc.) materials are used for the ILD. The typical flip chip packaging technology (such as the C4 flip chip package) mates the electrical terminals of the die to the terminals on the package substrate, when the two portions are aligned properly.

The process flow 100 of FIG. 1 includes the five process stages 101-105. The five process stages are referred to as substrate prebake 101, underfill material dispense 102, die placement 103, chip joint reflow 104, and underfill cure 105. As noted in FIG. 1, the substrate starts at room temperature prior to the prebake and may return to the room temperature after the last stage of underfill cure 105. However, during the five processing stages 101-105, the substrate is maintained at an elevated temperature. Accordingly, once the substrate enters the processing stages the operating temperature remains elevated until the assembly process has been completed at which point the assembly may be returned to room temperature. The five stages 101-105 are also illustrated in FIG. 2 in which the illustration shows a cross section of the operation performed on the substrate and/or the die.

In the prebake stage 101 the substrate is prebaked to a preselected prebake temperature. The elevated prebake temperature is employed to remove remaining moisture from the surface of a package substrate. Diagram 200 of FIG. 2 illustrates a package substrate 201 having terminal contacts 202 being prebaked in a prebake oven 220. A variety of ovens may be utilized to perform the operation of pre-baking the substrate 201. The prebake oven 220 may be of a variety of baking ovens, including a batch oven or in-line oven, to perform the baking operation. Typical temperatures for such ovens may reach to approximately 300° C. In some embodiments, the prebake stage may not be practiced, where moisture may not be present in appreciable quantities to have effect. Thus, prebake stage 101 may be by-passed in some instances.

Next, the underfill material dispense stage 102 is performed by an underfill dispenser 221, in which the underfill dispenser 221 dispenses underfill material 203 on the surface of the substrate 201. A variety of underfill material 203 may be dispensed onto the surface of the substrate 201. However, in one embodiment the underfill material is comprised of a low viscosity material commonly referred to as "no-flow" underfill material that functions as both flux during joint formation and underfill material after underfill post cure. A variety of "no-flow" underfill material may be utilized for underfill material 203.

A no-flow underfill material is a non-conductive material typically having a low viscosity property. One common underfill material comprises a resin-based material. The resin may comprise, but is not limited to, epoxy resin, siloxirane resin, superoxirane resin, polybenzoxazine resin, benzocyclobutane resin and/or mixtures of such resin. The base underfill material may include filler material(s), including silica and silicon-based oxides and nitrides, aluminum based oxides and nitrides, ceramics, and ceramic-based oxides and nitrides. Furthermore, the underfill material may also include additives, such as a fluxing agent, to remove metal oxide after the reflow stage. The underfill material may include a hardening agent or curing accelerator to improve the curing process. These and other additives may be present with the no-flow underfill material used with the various embodiments of the invention.

Subsequently, an microelectronic die, such as IC chip 205, is placed on the substrate 201 during the die placement stage 103 using a chip placement machine 222. In this operation, the terminals 207 (such as bump contacts) of the chip 205 are aligned with terminals 202 of the package substrate 201. Once the alignment of the terminals 202 to terminals 207 is established, the terminals 207 make contact with the terminals 202. Due to the low viscosity of the underfill material, the underfill material is easily dispensed on the surface of the substrate 201, allowing physical contact between the corresponding terminals 202 and 207. Generally, the temperature of the underfill dispense and die placement stages are lower than the substrate prebake stage. In one embodiment, the same temperature is applied to the underfill material dispense and the die placement stages. However, both temperatures are elevated above the room temperature.

It is to be noted that with the sequence of stages of process flow 100, the die placement occurs after the underfill dispensing operation. Unlike the prior art technique described in the background section, where the die placement occurred significantly before the underfill dispense operation, the described technique of process flow 100 insures that the underfill material is present prior to the placement of the chip on the package substrate. Although the underfill material is possibly not yet fully cured, it's presence provides mechanical support to the overlying ILD on the die and relieves some amount of mechanical stress to those portions of the die that have larger DNP (distance from neutral point, i.e. the distance from the center of die). This is typically along the fringes/periphery of the assembly. As noted, the chip placement machine 222 performs the chip placement operation. A variety of chip placement machines may be utilized and in one embodiment, a flip chip pick-and-place machine, such as a flip chip bonder, may be utilized.

Next is the chip joint reflow stage 104 in which a reflow machine, such as a reflow bonder 223 (or reflow oven) may be used for chip joint reflow to solder the two terminals together. In one technique, reflow is achieved by first placing solder paste on terminals 202 and/or 207 during one of the previous stages prior to the chip placement operation (or even prior to placing the substrate into a prebake oven), so that the solder is present between the two sets of terminals 202/207 prior to the reflow operation. The chip joint reflow operation melts the solder paste and bonds or solders the correspondingly aligned terminals 202/207 together. The reflow operation typically uses much higher temperatures in order to perform the reflow operation. Typically, the highest temperature encountered during the assembly process is during the chip joint reflow stage 104 to melt the solder to form the bond. If an oven is used, a variety of reflow ovens may be utilized, including inline zone SMT (surface mount technology) reflow ovens. In some instances slight pressure may be exerted having a vector perpendicular to the joint surface to improve the solder bond of the terminals 202, 207. In one embodiment, the die placement stage 103 and chip joint reflow stage 104 is completed in one integrated machine such as thermal compression bonder.

Subsequently, in the underfill cure stage 105, the underfill material 203 is cured in a post-cure oven 224. The underfill cure operation is typically performed at an elevated temperature, but that which is lower than the reflow temperature. Subsequently after the underfill cure stage 105, the assembly is removed and at this point the assembly is returned to room temperature. The post-cure oven may be a batch oven or inline zone oven. In one instance, the underfill material is already cured during chip joint reflow process, so that the post-cure of underfill material may be bypassed.

Figure 3:
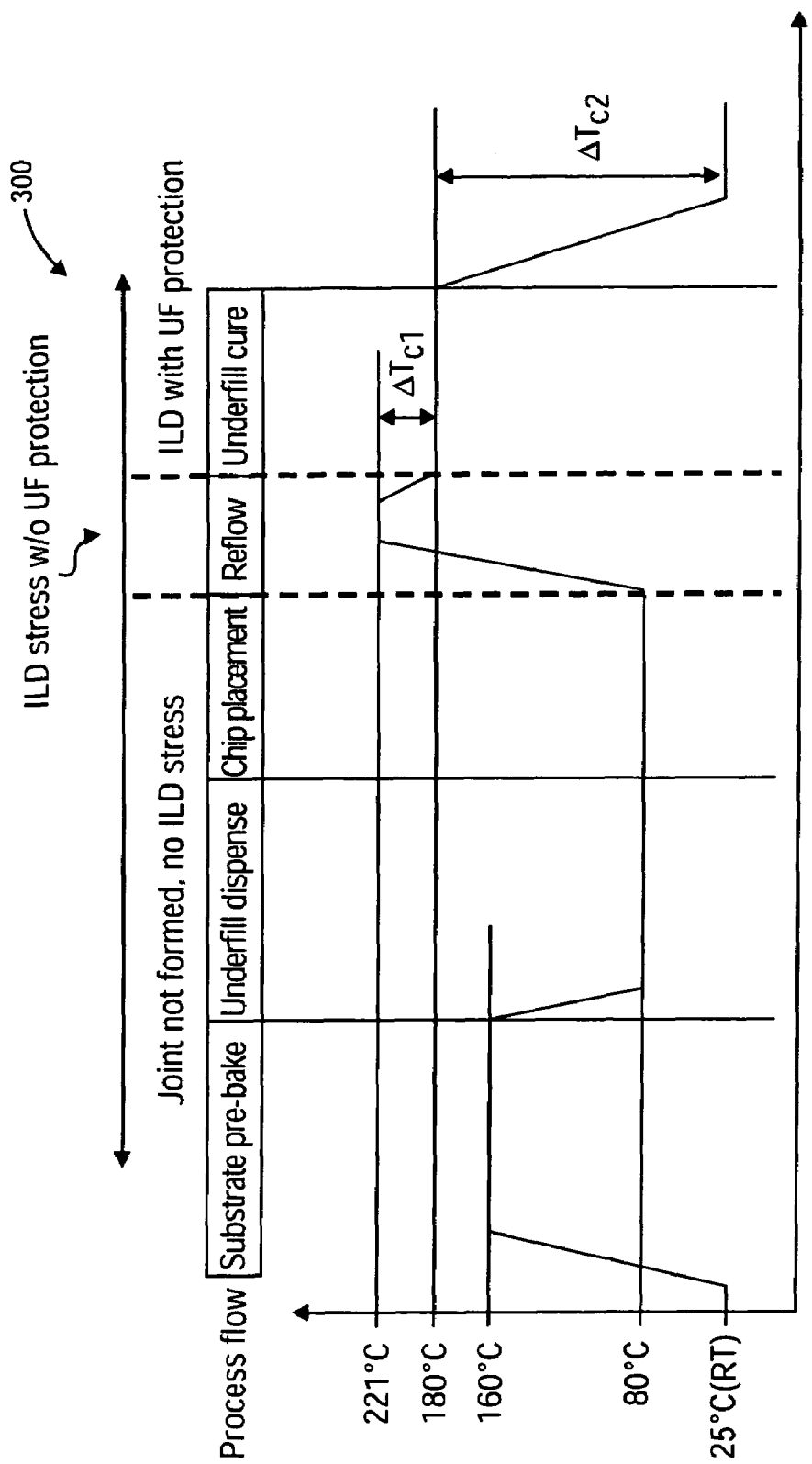
FIG. 3 shows one example temperature cycle to practice the process flow shown in FIG. 1.

Referring to FIG. 3, an example embodiment of a process flow to perform the sequence of stages of FIG. 1 is illustrated. Diagram 300 illustrates the five process stages 101-105 and the temperatures associated with the process flow for this particular example process. As shown in FIG. 3, the package substrate starts the process flow at room temperature (RT). The substrate is then prebaked during the prebake stage at a temperature of approximately 160° C. Then the temperature is lowered to approximately 80° C. to perform the underfill dispense operation. The temperature remains at 80° C. also during the chip placement stage of the process flow 300. Then, during the reflow stage, the temperature is raised to approximately 221° C. (or a range thereof) to perform the solder reflow operation. At the end of the reflow, the chip is attached (or bonded or soldered) to the package substrate and the final stage of underfill cure may then be performed.

In the diagram 300 the underfill cure is performed at approximately 180° C. Accordingly, the temperature differential from the reflow temperature of 221° C. to the underfill cure temperature of 180° C. is noted as ($\Delta T_{c1}$). After the conclusion of the underfill cure operation the assembly is then returned to room temperature where it leaves this manufacturing process. Thus, the temperature differential from 160° C. to room temperature (here 25° C. is used) is noted as $\Delta T_{c2}$ in diagram 300.

As noted in diagram 300, once the substrate enters the process flow, the temperature is elevated and only brought back to room temperature after the conclusion of the final underfill cure process. In the example process of diagram 300, the lowest elevated temperature encountered is 80° C., which is the temperature noted for the underfill dispense and chip placement operations. What is particularly interesting to note is that the temperature differential after the reflow operation ($\Delta T_{c1}$) is only 41° C. in this example. As noted in the Background section above, it is typical to encounter a temperature differential of approximately 200° C. or greater with prior processes. This drastic temperature differential is experienced in prior art techniques, since the chip/substrate assembly is brought back to room temperature after the reflow operation.

Additionally, with the described embodiments of the invention, the underfill material is dispensed just before the chip placement and reflow, allowing for some amount of support between the chip and the package substrate when reflow is performed. Additionally, it is to be noted that the electrical joint bonding performed during the reflow operation exerts the highest thermal stress. However, after the joint is formed, the mechanical stress placed on the chip package assembly is kept to a relatively lower value, since the substrate and the chip undergo a small temperature change ($\Delta T_{c1}$) before the underfill material is cured. Thus, materials having different coefficients of thermal expansion (CTE), such as the differences of CTE between silicon and dielectric materials, will experience less thermal-mechanical stress due to less temperature differential from reflow to underfill cure.

When the significant temperature differential $\Delta T_{c2}$ is encountered in returning the assembly to room temperature, the underfill material has been cured already, thereby relieving joint stress on the die ILD layers. As noted previously, the underfill material typically comprises a no-flow underfill material. This material is hardened when cured during the underfill cure stage. As note, the process flow maintains the package substrate at an elevated temperature until the assembly is complete. The sequence of process flow allows respective equipment/tool to have a layout in the assembly area, so that the substrate (and the die, once introduced into the process flow) may be transported from one device to another to maintain the elevated temperature(s). In some instances, heaters (such as backside heater on supports or chucks) may be utilized to maintain the elevated temperatures.

Figure 4A:
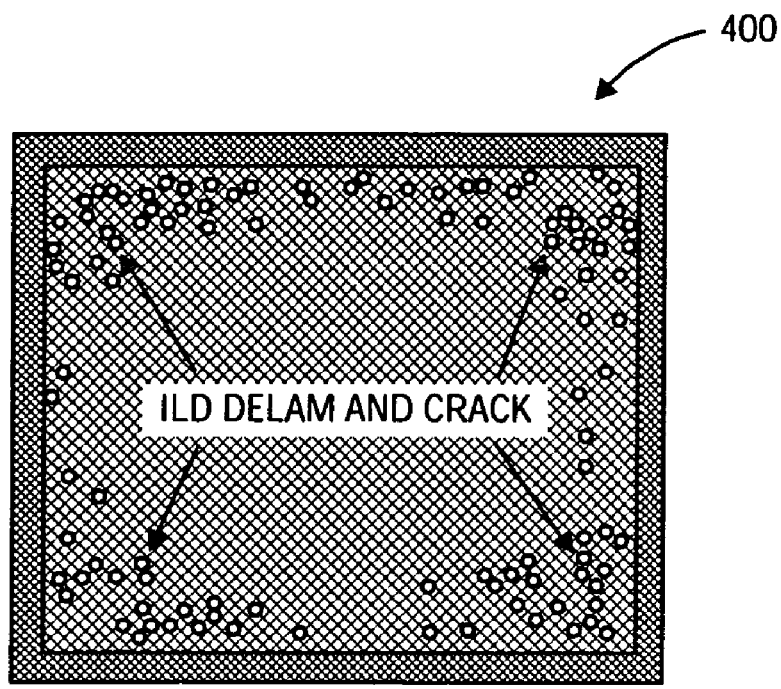
FIG. 4A shows ILD cracking and delamination on an assembled unit when prior art techniques are employed.
Figure 4B:
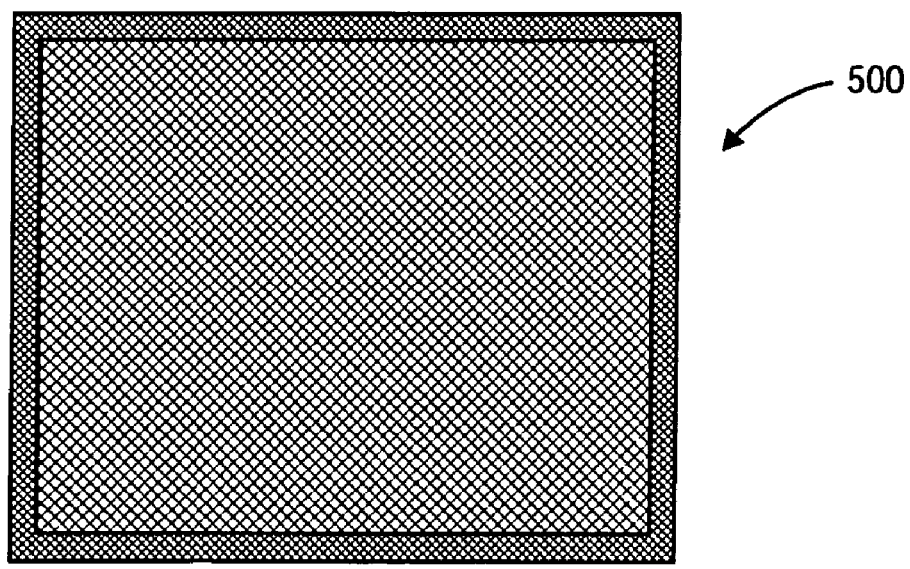
FIG. 4B shows no ILD cracking and delamination on an assembled unit when the technique of FIG. 1 is employed.

Accordingly, with lower temperature differential after the reflow process, less thermal-mechanical stress is experienced. The impact of the assembly process described above with the embodiments of the invention have significant results when low-k ILD or ultra low-k ILD materials are used. For example, FIG. 4A shows a package assembly 400 using a prior art technique, such as that described in the Background section above. The thermal-mechanical stress causes ILD delamination and cracking along the periphery. A similar package 500, but using an embodiment of the invention described above, is shown in FIG. 4B. In this instance, cracking and delamination of the ILD is not present in package 500. Thus, cracking is minimized or completely alleviated during the chip joint process at and after reflow. As shown in FIG. 3, the ILD stress without underlying underfill support occurs only during the reflow stage and prior to underfill cure. However, the temperature differential $\Delta T_{c1}$ is kept much smaller, so that thermal-mechanical stresses are lessened to prevent cracking and delamination of material layers, such as ILD layer(s). The assembly process may be implemented with minimal equipment or infrastructure change from current prior art techniques, but allows for significant improvement in chip attach and underfill process. The process also may allow terminals (bumps, contacts, pads, etc) to be designed anywhere without consideration for peripheral cracks and delamination.

Thus, a temperature sustaining flip chip process is described.

I claim:

1. An assembly comprising:
   a package substrate comprising a low-k dielectric material and package terminals on the dielectric materials wherein the low-k dielectric material is an ultra low-k dielectric material;
   a microelectronic die attached to the package substrate, the microelectronic die comprising a plurality of alternating metallic and low-k dielectric material layers and die terminals, the die terminals electrically connectable with the package terminals; and
   an underfill material between the package substrate and the microelectronic die, wherein the underfill material is a no-flow underfill material.

2. The assembly of claim 1, wherein the package substrate is prebaked prior to having the underfill material dispensed.

3. The assembly of claim 1, wherein the underfill material is deposited, microelectronic die attached and the underfill material cured without lowering the assembly to room temperature.

4. The assembly of claim 1, wherein microelectronic die is an integrated circuit chip.

5. The assembly of claim 1, wherein the underfill material comprises resin.

6. The assembly of claim 1, wherein the low-k dielectric material layers comprise an ultra low-k dielectric material.

7. The assembly of claim 1, further comprising solder bumps between the package terminals and the die terminals, the underfill material surrounding the solder bumps, die terminals and package terminals.

8. The assembly of claim 1, wherein the underfill material comprises a fluxing agent.

9. The assembly of claim 1, wherein the underfill material comprises a hardening agent or curing accelerator.

10. An assembly comprising: a package substrate comprising a low-k dielectric material and package terminals on the dielectric materials;
a microelectronic die attached to the package substrate, the microelectronic die comprising a plurality of alternating metallic and low-k dielectric material layers and die terminals, the die terminals electrically connectable with the package terminals, wherein the low-k dielectric material layers comprise an ultra low-k dielectric material; and
an underfill material between the package substrate and the microelectronic die, wherein the underfill material is a no-flow underfill material.

11. The assembly of claim 10, wherein the package substrate is prebaked prior to having the underfill material dispensed.

12. The assembly of claim 10, wherein the underfill material is deposited, microelectronic die attached and the underfill material cured without lowering the assembly to room temperature.

13. The assembly of claim 10, wherein microelectronic die is an integrated circuit chip.

14. The assembly of claim 10, wherein the underfill material comprises resin.

15. The assembly of claim 10, wherein the low-k dielectric material is an ultra low-k dielectric material.

16. The assembly of claim 10, further comprising solder bumps between the package terminals and the die terminals, the underfill material surrounding the solder bumps, die terminals and package terminals.

17. The assembly of claim 10, wherein the underfill material comprises a fluxing agent.

18. The assembly of claim 10, wherein the underfill material comprises a hardening agent or curing accelerator.

* * * * *